United States Patent
Hsu et al.

(10) Patent No.: US 6,175,929 B1
(45) Date of Patent: Jan. 16, 2001

(54) SYSTEM CLOCK SWITCH CIRCUIT OF A COMPUTER MAIN BOARD

(75) Inventors: Hsien-Yueh Hsu; Tien-Wei Lin, both of Taipei (TW)

(73) Assignee: Asus Tek Computer Inc., Taipei (TW)

( * ) Notice: Under 35 U.S.C. 154(b), the term of this patent shall be extended for 0 days.

(21) Appl. No.: 09/146,574

(22) Filed: Sep. 3, 1998

(30) Foreign Application Priority Data

Jun. 16, 1998 (TW) ................................................ 87109584

(51) Int. Cl.[7] ........................................................ G06F 1/08
(52) U.S. Cl. .......................... 713/500; 713/322; 713/400; 713/501
(58) Field of Search ..................................... 713/500, 501, 713/400, 1, 2, 322; 712/4; 709/230, 233

(56) References Cited

U.S. PATENT DOCUMENTS

| 5,191,657 | * | 3/1993 | Ludwig et al. ................... 710/105 |
| 5,432,913 | * | 7/1995 | Smits et al. ...................... 713/2 |
| 5,546,568 | * | 8/1996 | Bland et al. ..................... 713/501 |
| 5,555,381 | * | 9/1996 | Ludwig et al. ................... 710/101 |
| 5,600,839 | * | 2/1997 | MacDonald ...................... 713/322 |
| 5,644,760 | * | 7/1997 | Polzin et al. .................... 713/500 |
| 5,696,949 | * | 12/1997 | Young ............................. 713/400 |
| 5,719,510 | * | 2/1998 | Weidner .......................... 327/119 |
| 5,740,410 | * | 4/1998 | McDermott ...................... 713/501 |
| 5,815,692 | * | 9/1998 | McDermott ...................... 713/501 |
| 5,815,693 | * | 9/1998 | McDermott et al. ............. 713/501 |
| 5,850,546 | * | 12/1998 | Kim ................................ 713/1 |
| 5,862,351 | * | 1/1999 | He .................................. 710/104 |
| 5,909,571 | * | 6/1999 | Polzin et al. .................... 713/601 |
| 5,954,821 | * | 9/1999 | Young ............................. 713/400 |
| 6,006,327 | * | 12/1999 | Chang et al. .................... 713/1 |

* cited by examiner

Primary Examiner—Albert De Cady
Assistant Examiner—Nguyen Xuan Nguyen
(74) Attorney, Agent, or Firm—Thomas, Kayden, Horstemeyer & Risley (57) ABSTRACT

A system clock switch circuit for a computer main board sends a reset signal to the chipset from the clock generator or a additional reset signal generator as soon as the system clock frequency is changed by the CPU. In result, the computer main board restarts with a new system clock frequency after the reset signal is canceled to avoid the malfunctions caused by the non-synchronization between the system clock frequency and the clock frequencies of peripherals.

13 Claims, 5 Drawing Sheets

SYSTEM CLOCK SWITCH CIRCUIT OF A COMPUTER MAIN BOARD

CROSS-REFERENCE TO RELATED APPLICATION

This application claims the priority benefit of Taiwan application serial no. 87109584, filed Jun. 16, 1998, the full disclosure of which is incorporated herein by reference.

BACKGROUND OF THE INVENTION

1. Field of the Invention

This invention relates to a system clock switch circuit of a computer main board, and more particularly, to a system clock switch circuit of a computer main board that simultaneously sends out a reset signal and the frequency of the system clock changes. The reset signal restarts the computer with the new frequency, and prevents the computer from malfunctioning due to the non-synchronization between the computer main board and peripherals.

2. Description of Related Art

Since disclosure of the architectures of the IBM-compatible AT and XT personal computers to industry, the performance and the architectures of personal computers have been improved and modified by the entire computer industry in many ways. The major progress made on personal computers over the years includes upgrading the frequency of the central processing unit (CPU) clock, which started at 4.77 MHz and now exceeds 300 MHz. Because the frequency of the CPU is far beyond the clock frequency of a modern computer main board, every CPU contains two different frequencies, an internal frequency and an external frequency, wherein the external frequency is the same as the clock frequency of the computer main board. Currently, the clock frequencies of computer main boards used in industry include the standard 66 MHz and 100 MHz, and non-standard 75 MHz and 83 MHz.

Even though the clock frequency of a computer main board is selective, some peripherals still need to work under fixed frequencies. For example, a peripheral component interconnect (PCI) interface can only work at a frequency of 33 MHz and an accelerated graphics port (AGP) interface can only work at a frequency of 66 MHz. Hence, the ratio between the clock frequency of a computer main board and the clock frequency of a peripheral has to be considered when the clock frequency of the computer main board changes. For instance, in the case that the system clock frequency of a computer main board is 100 MHz, the clock frequency of an AGP interface is two thirds the system clock frequency, and the clock frequency of a PCI interface is one third the system clock frequency. If the system clock frequency is 66 MHz, the clock frequency of an AGP interface is equal to the system clock frequency, and the clock frequency of a PCI interface is one half the system clock frequency.

Figure 1:
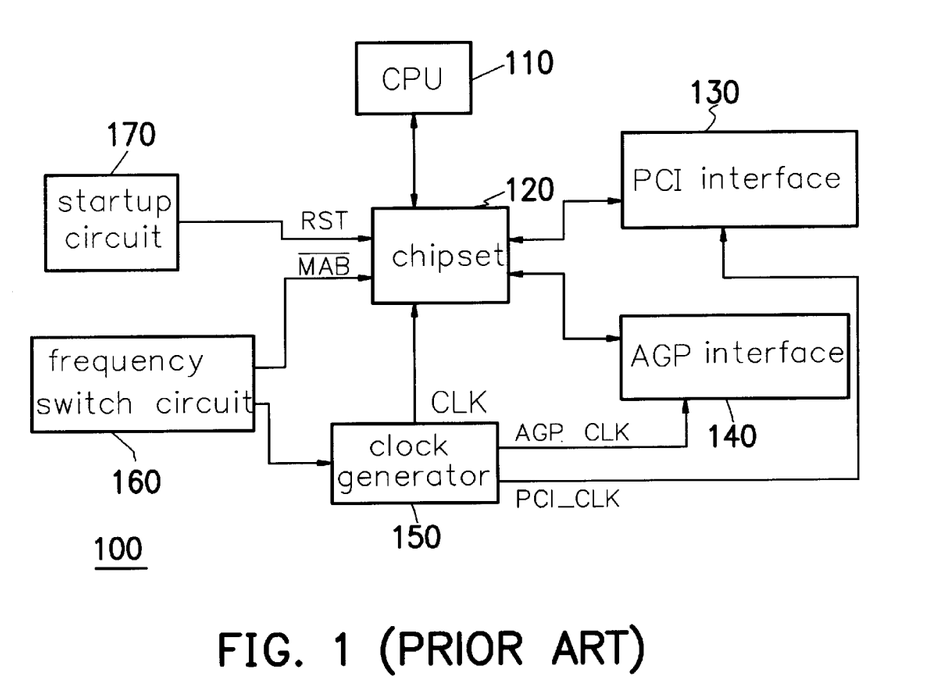
FIG. 1 is a schematic block diagram showing a conventional system clock switch circuit for a computer main board.

A block diagram representing a conventional computer main board is shown in FIG. 1, wherein the computer main board includes a CPU 110, a chipset 120, a PCI interface 130, an AGP interface 140, a clock generator 150, a frequency switch circuit 160, and a startup circuit 170. CPU 110 handles the operation of the entire computer main board. Chipset 120 is a single integrated circuit (IC) chip that contains all the integrated control circuits of the computer main board. So, a CPU communicates with peripherals on the computer main board, such as the PCI interface 130 and AGP interface 140, through the chipset 120.

Users can change the system clock frequency of a computer main board 100 through a frequency switch circuit 160. In an earlier design of a computer main board, jumps are used to set and change the system clock frequency. Since jumps must be set manually, which is not very convenient, a jumperless-setting design that combines software setup and hardware circuit is now used on most computer main boards.

Clock generator 150 provides clock signals CLK, AGP_CLK, and PCI_CLK, which are then sent to the chipset 120, the AGP interface 140, and the PCI interface 130, respectively. The clock generator 150 can be controlled by either hardware settings or commands from CPU 110. Currently, the most widely used controlling bus is an inter-integrated circuit ($I^2C$) bus introduced by Philips, wherein the $I^2C$ bus needs at least three signal lines, the data line, the clock line, and the reference ground line, to operate. Every peripheral connected to the $I^2C$ bus has with a unique ID code, so it is easy to hook up peripherals to an $I^2C$ bus.

Because the clock generator 150 can be controlled by commands from CPU 110, the system clock frequency of a computer main board can be set through software as well. Because the system clock frequency can be changed, chipset 120 determines the current system clock frequency through a lead $\overline{MAB}$, and determines the ratio of a peripheral, such as a PCI interface or an AGP interface, to the system clock frequency. f the information about system clock frequency obtained through $\overline{MAB}$ is not correct, the frequency used by the chipset 120 to communicate with peripherals is then accordingly incorrect and that causes system malfunction.

In addition, because the number of leads on the chipset 120 is limited by its size, a lead is used for different purposes at different moments. Chipset 120 only obtains information about the system clock frequency through the $\overline{MAB}$ when a reset signal RST is received, and then chipset 120 uses lead $\overline{MAB}$ for something else after the system starts, wherein the RST is provided by the startup circuit 170 to handle resetting the system. Because chipset 120 only determines the system clock frequency after receiving a reset signal RST, if a RST is not sent after the system clock frequency is changed, chipset 120 is then not able to find out the change in the system clock frequency.

Figure 2A:
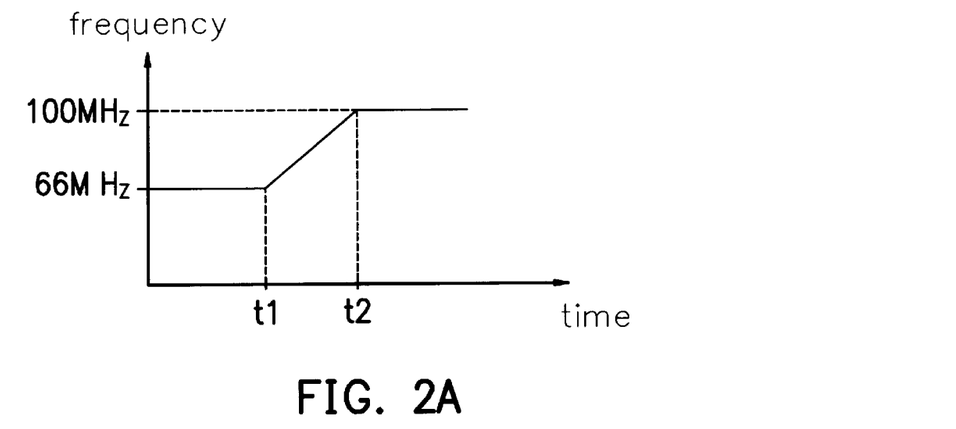
FIG. 2A is a schematic plot showing the change of the system clock frequency from 66 MHz to 100 MHz.
Figure 2B:
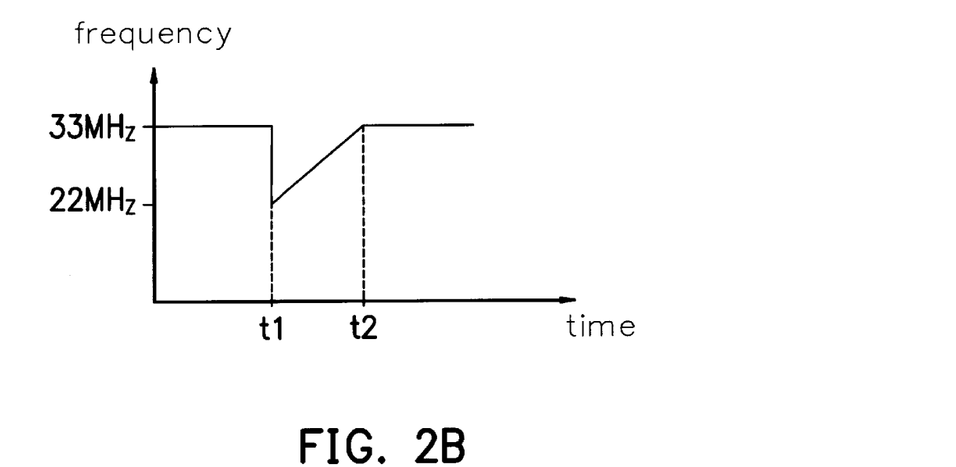
FIG. 2B is a schematic diagram showing the change of the system clock frequency from 66 MHz to 100 MHz at a PCI interface.
Figure 2C:
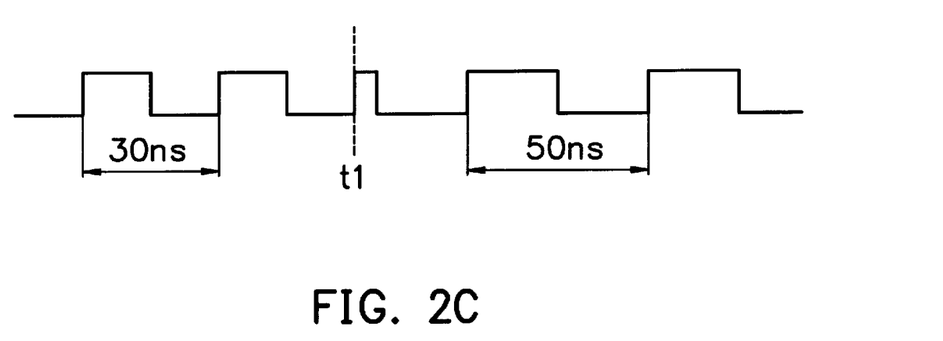
FIG. 2C is a schematic diagram showing the change of the system clock waveform from 66 MHz to 100 MHz at a PCI interface.

On the other hand, because the frequency multiplying circuit within CPU 110 is not able to respond to status, the clock generator 150 gradually change the system clock frequency to a desired one after a command tp change frequency is received. As shown in FIG. 2A, the system clock frequency is changed from 66 MHz at t1 to 100 MHz at t2 after the clock generator 150 receives a command to change system clock frequency. However, the frequencies of peripherals, such as PCI and AGP interfaces, are simply obtained by dividing the system clock frequency by fixed ratios. In result, the frequencies at the peripheral interfaces change steeply after a command to change frequency is received by the clock generator, and then gradually relapse, as shown in FIG. 2B. The clock signal CLK at the peripheral interface due to a steep frequency change is shown in FIG. 2C, which causes system malfunctions, such as a glitch, or even system lockup, after the time t1.

Figure 3A:
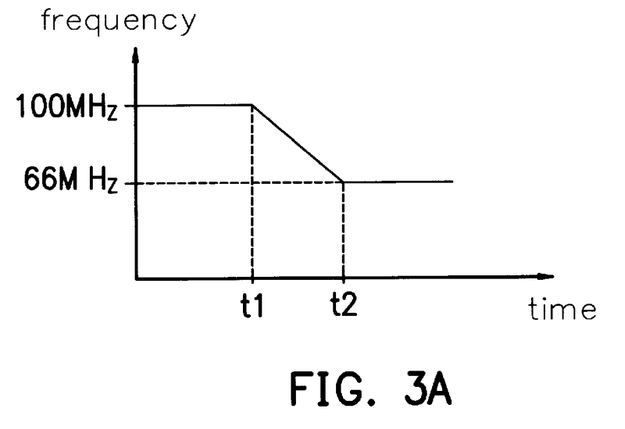
FIG. 3A is a schematic plot showing the change of the system clock frequency from 100MHz to 66MHz.
Figure 3B:
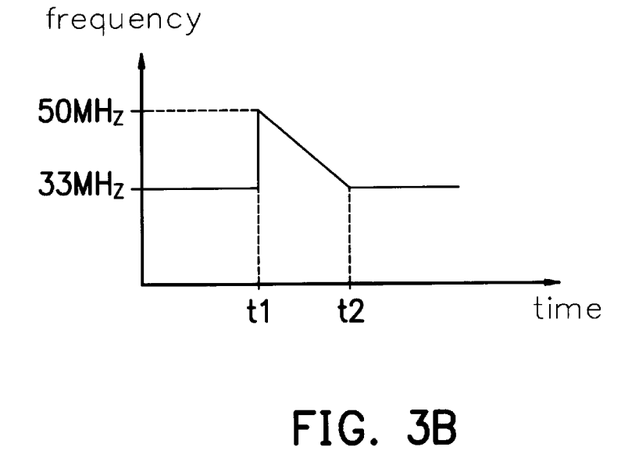
FIG. 3B is a schematic diagram showing the change of the system clock frequency from 100 MHz to 66 MHz at a PCI interface.
Figure 3C:
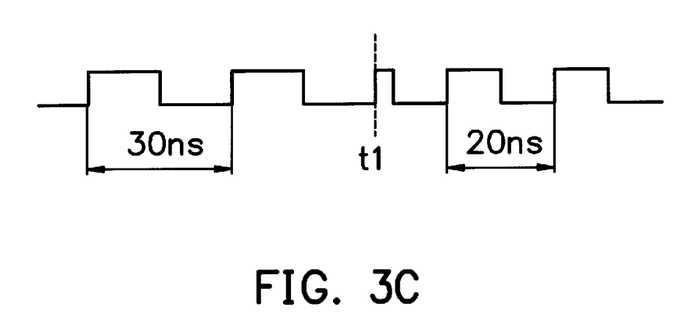
FIG. 3C is a schematic diagram showing the change of the system clock waveform from 100 MHz to 66 MHz at a PCI interface.

FIGS. 3A to 3C show the other cases where frequency changes from 100MHz to 66MHz during the time t1 to t2. Similarly, system malfunction, such as a glitch or even system lockup, happens after the time t1.

According to the foregoing description, a conventional frequency switching method for a computer main board has the following drawbacks:

1. When the frequency from the clock generator changes, a reset signal is not simultaneously sent to the chipset to notify the chipset of the change in the frequency. The chipset is not able to communicate with peripherals with the proper frequency, and that causes system malfunctioning.
2. As soon as the clock generator receives a command to change frequency, it gradually changes the system clock frequency, while it immediately changes the frequency ratio. The frequency ratio change causes steep frequency changes at peripheral interfaces, and that leads to system malfunctioning, such as a glitch or even system lockup.

SUMMARY OF THE INVENTION

It is therefore an objective of the present invention to provide a system clock switch circuit for a computer main board that simultaneously sends out a reset signal with the change in the system clock frequency from the clock generator. The chipset is capable of communicating with peripherals at correct frequencies to ensure that the system works properly.

It is another an objective of the present invention to provide a system clock switch circuit for a computer main board that sends out a reset signal as soon as the clock generator receives a command to change system frequency and changes the system clock. The reset signal remains until the system clock frequency becomes stable. No steep changes in the clock frequency happen at the peripheral interfaces, which ensures that the system works properly.

In accordance with the foregoing and other objectives of the present invention, the invention provides a preferable system clock switch circuit for a computer main board including a CPU, a chipset, and a clock generator.

The CPU, which is in charge of the operations of the computer main board, communicates with peripherals and controls the clock generator through the chipset, wherein the clock generator provides the chipset with a system clock frequency and a reset signal for operating the computer main board.

When the CPU changes the system clock frequency from the clock generator through the chipset, the clock generator changes the system clock frequency and, in the mean time, sends out a reset signal. The reset signal remains until the system clock frequency is completely changed.

The invention provides another preferred system clock switch circuit for a computer main board including a CPU, a chipset, a clock generator, and a reset signal generator.

The clock generator provides the CPU with a clock frequency for operating the computer main board. The reset signal generator provides the chipset with a reset signal. The CPU controls both the reset signal generator and the clock generator.

When the CPU changes the system clock frequency from the clock generator through the chipset, the clock generator changes the system clock frequency and, in the mean time, the reset signal generator sends out a reset signal. The reset signal remains until the system clock frequency is completely changed.

According to a preferred embodiment of the invention, the system clock switch circuit for a computer main board further includes a status latch. When the CPU changes the system clock frequency, a parameter is stored in the status latch. At the moment that the computer is reset, the chipset retrieves the parameter stored in the status latch to determine parameters used for communicating with peripherals. The CPU controls the clock generator through an I²C bus within the chipset.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new system clock switch circuit for a computer main board.

Figure 4:
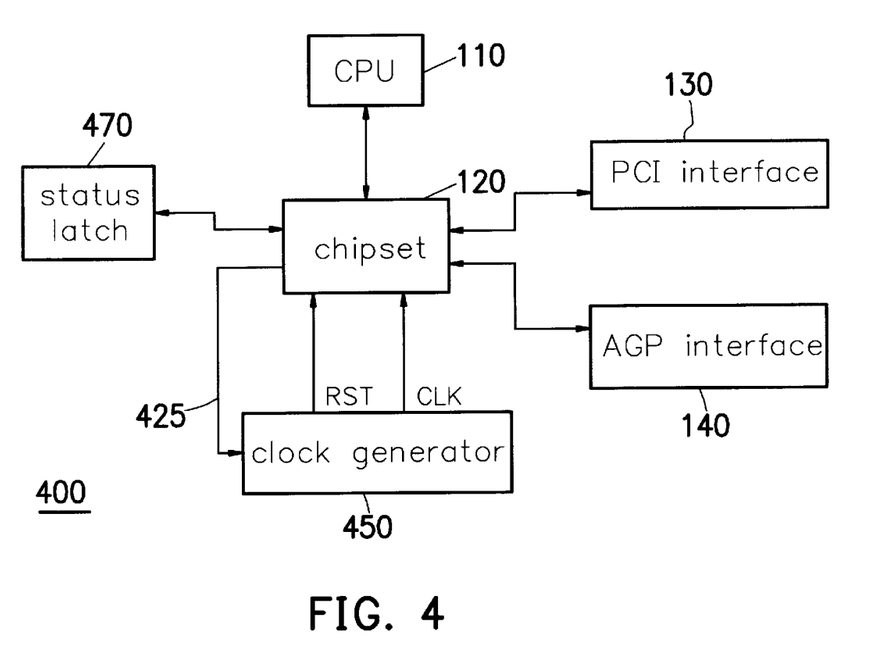
FIG. 4 is a schematic block diagram showing the system clock switch circuit for a computer main board of a preferred embodiment according to the invention.

Referring to FIG. 4, a computer main board 400 comprises a CPU 110, a chipset 120, a PCI interface 130, an AGP interface 140, a clock generator 450, and a status latch 470. The clock generator 450 provides a system clock frequency and a system clock switch circuit needed for operating the computer main board.

The CPU 110 is in charge of the operations of the entire computer main board. The chipset 120 integrates controlling circuits on the computer main board 400 into an integrated circuit (IC), so that the CPU 110 communicates with peripherals, such as a PCI interface 130 and an AGP interface 140, on the computer main board 400 through the chipset 120. The AGP interface 140 is used to install a display card, and the PCI interface is used to install other peripheral interfaces.

The status latch 470 stores a status parameter of the system clock frequency. When the system is reset, the chipset 120 retrieves the status parameter of the system clock frequency from the status latch 470 to update the system clock frequency and setup the clock frequencies of the peripherals on the computer main board 400.

The clock generator 450 provides a system clock frequency and a clock frequency switch circuit needed for operating the computer main board. The clock signal CLK and the reset signal RST are sent to the chipset 120 from the clock generator 450 for operating the computer main board 400. The CPU 110 controls the clock generator 450 through a control signal bus 425, such as an I$^2$C bus, of the chipset 120, which is equipped with the interface corresponding to the control signal bus.

As the CPU 110 sends a command to change the system clock frequency CLK to the clock generator 450 through the chipset 120, a status parameter is set and stored in the status latch 470. As soon as the clock generator 450 receives the command to change the system clock frequency CLK, it changes the system clock frequency and, in the mean time, activates the reset signal RST. The reset signal RST remains its activation until the system clock frequency CLK is completely changed to the new setting. During the activation of the reset signal RST, the chipset 120 retrieves the status parameter from the status latch 470 to obtain the new setting of the system clock frequency CLK for determining the ratios between the system clock frequency and peripherals.

The foregoing system clock switch circuit, which is based on a modified clock generator, simultaneously sends out a reset signal with the system clock frequency change. However, the clock generator used in the foregoing design contains a new circuit, so an existing clock generator cannot be employed in that design. Therefore, another preferred embodiment of the invention that contains a reset signal generator working with an existing clock generator is introduced.

Figure 5:
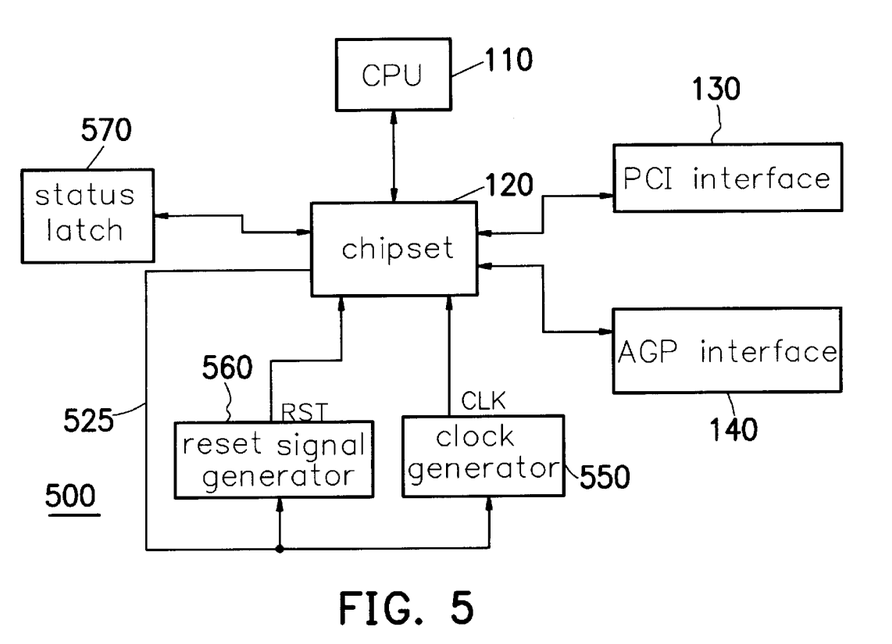
FIG. 5 is a schematic block diagram showing the system clock switch circuit for a computer main of another preferred embodiment according to the invention.

Referring to FIG. 5, a computer main board 500 contains a CPU 110, a chipset 120, a PCI interface 130, an AGP interface 140, a clock generator 550, a reset signal generator 560, and a status latch 570. The clock generator 550 and the reset signal generator 560 provide a system clock frequency and a system clock switch circuit for operating the computer main board.

Similar to the circuit in the previous embodiment, the CPU 110 is in charge of the operations of the entire computer main board. The chipset 120 integrates controlling circuits on the computer main board 500 into an IC, so that the CPU 110 communicates with peripherals, such as a PCI interface 130 and an AGP interface 140, on the computer main board 500 through the chipset 120. The status latch 570 stores a status parameter of the system clock frequency. When the system is reset, the chipset 120 retrieves the status parameter of the system clock frequency from the status latch 570 to update the system clock frequency and setup the clock frequencies of the peripherals on the computer main board 500.

The clock generator 550 and the reset signal generator 560 provide a system clock frequency and a system clock switch circuit needed for operation of the computer main board. The clock generator 550 sends a system clock frequency CLK to the chipset 120, and the reset signal generator 560 sends a reset signal RST to the chipset 120. The CPU 110 controls both the clock generator 550 and the reset signal generator 560 through the chipset 120 and a control bus 525. The control bus 525 includes an I$^2$C bus, and the chipset 120 contains an interface corresponding to the control bus. When commands are sent from the CPU 110 to the clock generator 550 through the chipset 120 and the control bus 525, the reset signal generator 560 keeps checking on the commands from the chipset 120 to the clock generator 550. As soon as a command to change system clock frequency is found, the reset signal generator immediately activates a reset signal RST. The reset signal RST remains activated until the system clock frequency is completely changed to the new setting.

Hence, if the system clock frequency CLK needs to be changed, a command to change system clock frequency has to be sent from the CPU 110 to the clock generator 550 through the chipset 120, and a status parameter needs to be set and stored in the status latch 570. Then, the clock generator 550 gradually changes the system clock frequency CLK to the new setting. At the same time, the reset signal generator 560 detects that the system clock is to be changed; it immediately activates a reset signal RST, wherein the reset signal RST is cancelled until the system clock frequency CLK is completely changed to the new setting. While the reset signal RST is activated, the chipset 120 obtains a status parameter from the status latch 570, and determines the ratios between the system clock frequency and clock frequencies of peripherals by referring to the status parameter.

Figure 6:
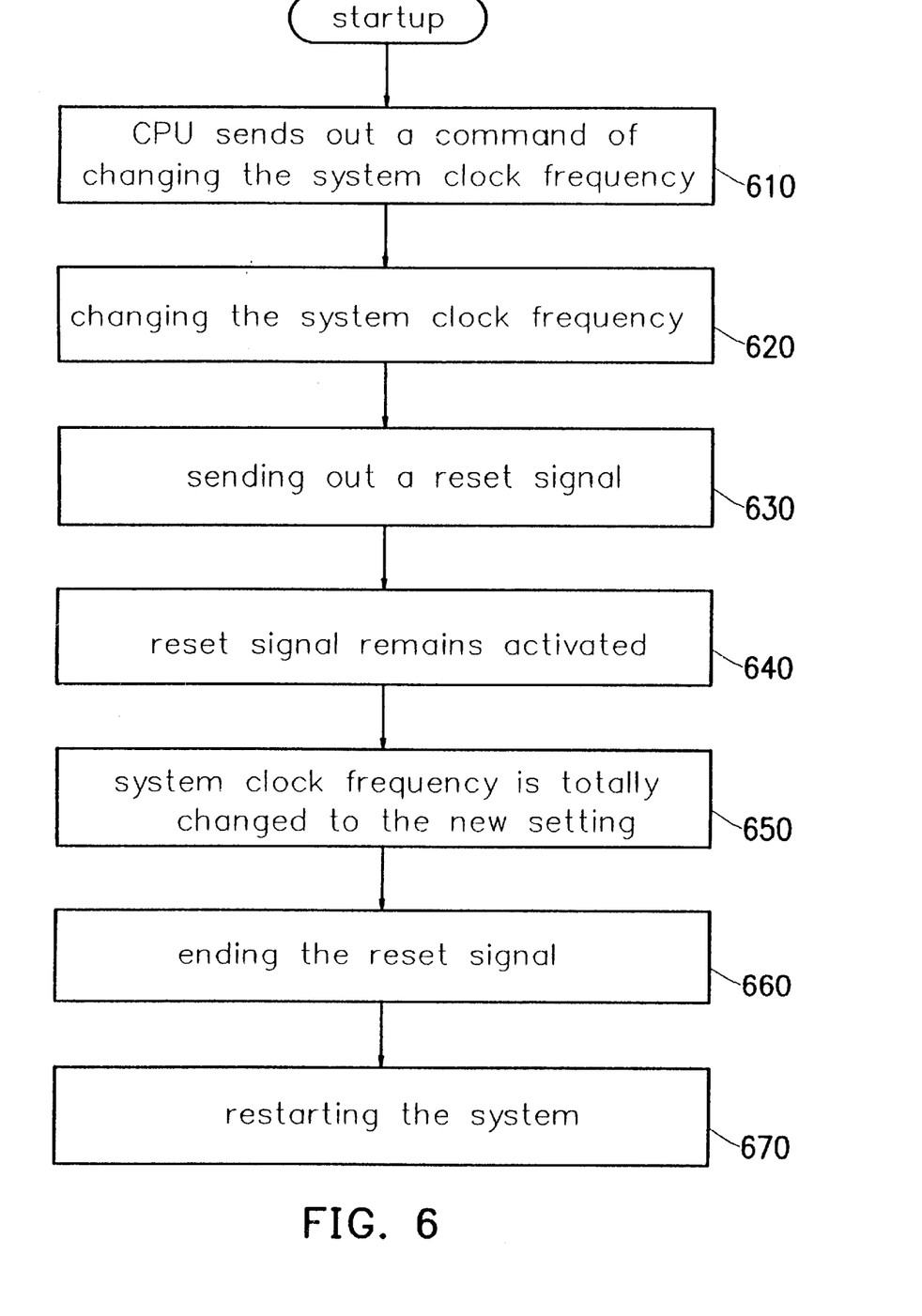
FIG. 6 is a flowchart showing the frequency switching procedures of the system clock switch circuit for a computer main board according to the invention.

In accordance with the foregoing, the two preferred embodiments of the invention both activate a reset signal as soon as the system clock frequency is changed. As shown in FIG. 6, a flowchart is used to provide more detailed description on the functions of the two embodiments according to the invention.

First, for the first preferred embodiment of the invention, the block 610 represents the CPU 110 sending a command to change system clock frequency to the clock generator 450 through the chipset 120. Then, in block 620, the clock generator 450 changes the system clock frequency CLK gradually to the new setting after it receives the command from the CPU 110. In the next step, block 630, the clock generator 450 sends a reset signal RST to the chipset 120 as soon as it starts to change the system clock frequency CLK. Then, in block 640, the reset signal RST from the clock generator 450 remains activated until the next step, block 650, in which the system clock frequency CLK is completely changed to the new setting, is done. In block 660, the clock generator 450 then cancels the reset signal RST, and the chipset 120 obtains a status parameter from the status latch 470. And then, in block 670, the computer is restarted with the new system clock frequency and new status parameter.

Next, for the second preferred embodiment of the invention, the block 610 represents the CPU 110 sending a command to change system clock frequency to the clock generator 550 and the reset signal generator 560 through the chipset 120. Then, in block 620, the clock generator 550 gradually changes the system clock frequency CLK to the new setting after it receives the command from the CPU 110. In the next step, block 630, the reset signal generator 560 sends a reset signal RST to the chipset 120 as soon as it detects the command sent to the clock generator 550 from the chipset 120 is about to change the system clock frequency CLK. Then, in block 640, the reset signal RST from the reset signal generator 560 remains activated until the next step, block 650, in which the system clock frequency CLK is completely changed to the new setting, is done. In block 660, the reset signal generator 560 then cancels the reset signal RST, and the chipset 120 obtains a status parameter from the status latch 570. Then, in block 670, the computer is restarted with the new system clock frequency and new status parameter.

According to the foregoing, the invention includes at least the following advantages over a conventional system clock switch circuit:

1. As soon as the clock generator starts to change the system clock frequency, a reset signal is sent to alert the chipset that the system clock frequency is about to be changed, so that the chipset and peripherals are able to communicate with each other with correct clock frequencies.

2. Even though the system clock frequency is gradually changed to a new setting, the presence of a reset signal prevents the clock frequencies of peripherals from being steeply changed before the system clock frequency is completely changed to a new setting, so that glitches are avoided.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A system clock switch circuit of a computer main board, the circuit comprising:

a central processing unit (CPU), for operating the computer main board;

a chipset, connected to the CPU, wherein the CPU communicates with a peripheral of the computer main board through the chipset; and a clock generator, connected to the chipset, providing a system clock frequency and a reset signal for operating the computer main board, wherein the clock generator is controlled by the CPU through the chipset and the clock generator is controlled through a control signal bus, such that when the clock generator needs to change the system clock frequency according to a command from the CPU, the clock generator activates the reset signal simultaneously to reset a clock frequency of the peripheral from a current frequency to an intended frequency with respect to the system clock frequency where the intended frequency can be repeatedly reset until the intended frequency matches in ratio to the system clock frequency, and the reset signal remains activation until the system clock frequency is completely changed to a new setting.

2. The circuit of claim 1, wherein the circuit further comprises a status latch for storing a status parameter set by the CPU as soon as the system clock frequency is changed, wherein the set status parameter is retrieved by the chipset from the status latch to determine a ratio of the system clock frequency to a clock frequency of the peripheral after the computer main board is restarted.

3. The circuit of claim 1, wherein the control signal bus includes an inter-integrated circuit (I²C) bus.

4. The circuit of claim 3, wherein the chipset comprises an I²C bus interface that is used by the CPU to control the clock generator.

5. A system clock switch circuit of a computer main board, the circuit comprising:

a CPU, for operating the computer main board;

a chipset, connected to the CPU, wherein the CPU communicates with a peripheral of the computer main board through the chipset;

a clock generator, connected to the chipset, providing the chipset with a system clock frequency for operating the computer main board, wherein the CPU controls the clock generator through the chipset, and the clock generator is controlled through a first control signal bus; and a reset signal generator, connected to the chipset and controlled by the CPU through the chipset, which provides the chipset with a reset signal, wherein the reset signal generator is controlled through a second control signal bus, such that when the clock generator needs to change the system clock frequency according to a command from the CPU, the reset signal generator activates the reset signal simultaneously for changing a clock frequency of the peripheral from a current frequency to an intended frequency with respect to the system clock frequency where the intended frequency can be repeatedly reset until the intended frequency matches in ratio to the system clock frequency and the reset signal remains activation until the system clock frequency is completely changed to a new setting.

6. The circuit of claim 5, wherein the circuit further comprises a status latch for storing a status parameter set by the CPU as soon as the system clock frequency is changed, wherein the set status parameter is retrieved by the chipset from the status latch to determine a ratio of the system clock frequency to a clock frequency of the peripheral after the computer main board is restarted.

7. The circuit of claim 5, wherein the first control signal bus includes an I²C bus.

8. The circuit of claim 7, wherein the second control signal bus includes an I²C bus.

9. The circuit of claim 8, wherein the chipset comprises an I²C bus interface that is used by the CPU to control the clock generator and the reset signal generator.

10. A method for switching system clock of a computer main board, the method comprising:

providing a CPU;

providing a clock generator, for generating a system clock frequency;

sending out a command from the CPU to the clock generator to change the system clock frequency;

sending out a reset signal from the clock generator as soon as the clock generator starts to change the system clock frequency wherein the reset signal resets a clock frequency of a peripheral from a current frequency to an intended frequency with respect to the system clock frequency where the intended frequency can be repeatedly reset until the intended frequency matches in ratio to the system clock frequency, and canceling the reset signal by the clock generator as soon as the system clock frequency is changed to a new setting.

11. The method of claim 10, wherein the method further comprises providing a status latch for storing a status parameter set by the CPU as soon as the system clock frequency is changed, wherein the set status parameter is retrieved by the chipset from the status latch to determine a ratio of the system clock frequency to a clock frequency of the peripheral after the computer main board is restarted.

12. A method for switching system clock of a computer main board, the method comprising:

providing a CPU;

providing a clock generator, for generating a system clock frequency;

sending out a command from the CPU to the clock generator to change the system clock frequency;

sending out a reset signal from a reset signal generator as soon as the clock generator starts to change the system clock frequency, wherein the reset signal resets a clock frequency of a peripheral from a current frequency to an intended frequency with respect to the system clock frequency where the intended frequency can be repeatedly reset until the intended frequency matches in ratio to the system clock frequency, and canceling the reset signal from the reset signal generator as soon as the system clock frequency is changed to a new setting.

13. The method of claim 12, wherein the method further comprises providing a status latch for storing a status parameter set by the CPU as soon as the system clock frequency is changed, wherein the set status parameter is retrieved by the chipset from the status latch to determine a ratio of the system clock frequency to a clock frequency of the peripheral after the computer main board is restarted.

* * * * *